United States Patent
Maas et al.

(10) Patent No.: US 11,977,337 B2
(45) Date of Patent: May 7, 2024

(54) LITHOGRAPHIC PATTERNING METHOD

(71) Applicant: Nederlandse Organisatie voor toegepast-natuurwetenschappelijk onderzoek TNO, 's-Gravenhage (NL)

(72) Inventors: Diederik Jan Maas, Breda (NL); Hamed Sadeghian Marnani, Nootdorp (NL); Emile Van Veldhoven, Espoo (FI)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 516 days.

(21) Appl. No.: 17/312,075

(22) PCT Filed: Dec. 12, 2019

(86) PCT No.: PCT/NL2019/050830
§ 371 (c)(1),
(2) Date: Jun. 9, 2021

(87) PCT Pub. No.: WO2020/122721
PCT Pub. Date: Jun. 18, 2020

(65) Prior Publication Data
US 2022/0026816 A1 Jan. 27, 2022

(30) Foreign Application Priority Data
Dec. 14, 2018 (EP) .................................. 18212611

(51) Int. Cl.
*G03F 7/00* (2006.01)
(52) U.S. Cl.
CPC ........ *G03F 7/70625* (2013.01); *G03F 7/7065* (2013.01)
(58) Field of Classification Search
CPC . G03F 7/70625; G03F 7/7065; G03F 7/70675
(Continued)

(56) References Cited

U.S. PATENT DOCUMENTS

2019/0154636 A1* 5/2019 Sadeghian Marnani .................... G01Q 40/00
2022/0057720 A1* 2/2022 Maas .................. G03F 7/70358

FOREIGN PATENT DOCUMENTS

EP 2500776 A2 9/2012
JP 11-174065 7/1999

OTHER PUBLICATIONS

European Patent Office, International Search Report in corresponding International Application No. PCT/NL2019/050830 dated Apr. 3, 2020 (3 pages).

(Continued)

*Primary Examiner* — Caleen O Sullivan
(74) *Attorney, Agent, or Firm* — Leydig, Voit & Mayer, Ltd.

(57) ABSTRACT

The present document describes a lithographic patterning method for creating features on a surface of a substrate. The patterning method includes the steps of applying a resist material to the substrate surface for providing a resist material layer, selectively exposing, dependent on a location and based on patterning data, the resist material layer to a surface treatment step for chemically modifying the resist material of the resist material layer, and developing, based on the chemical modification of the resist material, the resist material layer such as to selectively remove the resist material. In particular, prior to the step of developing, the method comprises a step of scanning at least a part of the surface using an acoustic scanning probe microscopy method for determining a local contact stiffness of the substrate surface at a plurality of locations, for measuring one or more critical dimensions of the features to be formed on the surface.

14 Claims, 4 Drawing Sheets

(58) Field of Classification Search
USPC .................................................. 430/311, 30
See application file for complete search history.

(56) References Cited

OTHER PUBLICATIONS

Van Es et al., "Image Based Overlay and Alignment Metrology Through Optically Opaque Media with Sub-surface Probe Microscopy," Proceedings of SPIE, vol. 10585 (2018) ISSN: 0277-786X vol. 10524, XP060101426.

K.B. Crozier et al., "Thin film characterization by atomic force microscopy at ultrasonic frequencies" Applied Physics Letters, AIP Publishing LLC vol. 76, No. 14 (2000) ISSN: 003-6951, XP012024991.

K.C. Hickman et al., "Use of Diffracted Light From Latent Images to Improve Lithography Control," Proceedings of SPIE/ IS&T, Mar. 4, 1991—ISBN 978-1-62841-730-2; ISBN 1-62841-730-7, vol. 1464, pp. 245-257, XP008008652 (1991).

* cited by examiner

LITHOGRAPHIC PATTERNING METHOD

CROSS-REFERENCE TO RELATED APPLICATIONS

This patent application is a U.S. National Phase of PCT International Application No. PCT/NL2019/050830, filed Dec. 12, 2019, which claims priority to European Application No. 18212611.0, filed Dec. 14, 2018, which are both expressly incorporated by reference in their entireties, including any references contained therein.

FIELD OF THE INVENTION

The present invention is directed at a lithographic patterning method for creating features on a surface of a substrate, the patterning method including the steps of: applying a resist material to the substrate surface for providing a resist material layer; selectively exposing, dependent on a location and based on patterning data, the resist material layer to a surface treatment step for chemically modifying the resist material of the resist material layer; and developing, based on the chemical modification of the resist material, the resist material layer such as to selectively remove the resist material. The invention is further directed at a manufacturing method for fabricating a semiconductor element, and a semiconductor element manufactured using such a method.

BACKGROUND

Nanolithography is concerned with the creation of structures or patterns of nanometer scale, and is for example applied to manufacture the tiniest structures in semiconductor elements. The field of nanolithography, for that reason, is of continuing growing interest to the semiconductor industry, as it enables to meet the requirements underlying technological advancement in many kinds of areas of application. Nanolithography is the collective name for a number of different technologies that allow the fabrication of such nanometer scale structures. Although some of these technologies substantially differ from the others, a majority of nanolithography methods have the abovementioned steps in common. A resist material layer is formed on a substrate, and the resist material is exposed to a treatment step to induce a chemical modification. This, subsequently allows the application of a development step for the selective removal of only the chemically modified material (or, alternatively, the removal of only the chemically unmodified material). In some cases, the structures are thereby directly formed from the resist material, but in most cases the selective removal of resist material results in the resist material layer to provide a patterned mask for a subsequent step, such as etching of the substrate material underneath.

One disadvantage of the above technology is that the measuring of critical dimensions and the detection of defects therein, is only possible after the development step. Although the selective exposure step can be performed accurately, there is no way of checking whether the results of that step are satisfactory. Once developed, it is possible to verify the critical dimensions and detect any defects, however at that time it is no longer possible to make corrections. If any defects are detected, the respective semiconductor element that is being created must be considered lost.

SUMMARY OF THE INVENTION

It is an object of the present invention to resolve the abovementioned disadvantages and to provide a lithographic patterning method which allows both detection and timely correction of critical dimensions and defects, such as to increase the yield of the process.

To this end, there is provided herewith a lithographic patterning method for creating features on a surface of a substrate, the patterning method including the steps of: applying a resist material to the substrate surface for providing a resist material layer; selectively exposing, dependent on a location and based on patterning data, the resist material layer to a surface treatment step for chemically modifying the resist material of the resist material layer; and developing, based on the chemical modification of the resist material, the resist material layer such as to selectively remove the resist material; wherein the method, prior to the step of developing, comprises a step of scanning at least a part of the surface using an acoustic scanning probe microscopy method for determining a local contact stiffness of the substrate surface at a plurality of locations, for measuring one or more critical dimensions of the features to be formed on the surface.

The present invention adds an additional verification step to be performed during patterning, prior to the development of the resist. In this stage, upon detection of any defects it is still possible to correct the patterning process to prevent loss of the device to be produced. Specifically, the present invention proposes to perform an acoustic scanning probe microscopy process to be performed by scanning the substrate surface with a probe tip.

The acoustic scanning probe microscopy process may be of various different kinds. For example, ultrasonic force microscopy (UFM) may be applied wherein the sample substrate is acoustically excited at ultrasonic frequencies above a contact resonance frequency of the probe. The nonlinear nature of the tip-sample interaction can cause the cantilever to experience an effective (time-averaged) force depending on an amplitude and force-indentation relationship, which depends on the contact stiffness and is therefore indicative of differences in the chemical composition of the resist material underneath it. Monitoring the (time-averaged) force on the cantilever as a function of an ultrasound amplitude therefore allows for the visualization of these chemical modifications in the resist material. This enables verification of the patterning process and whether it corresponds to the patterning data, whether the critical dimensions for proper operation of the semiconductor element have been met, and whether there are any defects. As another example, in contact resonance scanning probe microscopy (CR-SPM), a sensitivity of the shift in the contact resonance frequency to the material properties in an extended volume around the tip-sample contact is utilized for detecting the chemical modifications in the resist material and for sub-surface imaging. Furthermore, as yet another example, in subsurface ultrasonic resonance force microscopy (SSURFM) high frequency ultrasound waves can be combined with AFM measurements to detect viscoelastic properties of chemically modified resist material and subsurface features, wherein a large mechanical impedance of the cantilever at high ultrasound frequencies (cf. UFM) is combined with the sensitivity of the cantilever's resonance to the mechanical properties of the sample (cf. CR-SPM).

As follows from the above, acoustic scanning probe microscopy methods may advantageously be applied to perform verification of the selective exposure step subsequent to or even during the exposure step. This directly allows correction of defects and thereby enables to prevent loss of the semiconductor elements during fabrication thereof.

In accordance with some embodiments, the scanning step includes applying, using a sample transducer, an acoustic signal to the substrate while simultaneously contacting the substrate surface with a probe tip of a probe of a scanning probe microscopy device, wherein the acoustic signal includes a carrier frequency which is modulated with a modulation frequency, wherein the modulation frequency is selected to be on or near an expected contact resonance frequency of the probe with respect to the substrate surface. Applying a modulation frequency on or near the contact resonance frequency provides a strong response signal to the applied acoustic signal in the probe tip and cantilever of the probe. Any shifts in contact resonance frequency, e.g. due to differences in chemical composition of the resist material underneath the probe tip, results in the intensity of the response signal to change as well. The sensed response signal is thus strongly dependent on the matching between the modulation frequency of the acoustic signal on one hand and the (shifting) contact resonance frequency on the other hand. A change in the contact resonance frequency, which indicates a change in the contact stiffness, thus indicates a difference in the material underneath the probe tip (e.g. indicative of the chemically modified resist material).

In some of these embodiments, the modulation frequency is selected to be within at most 20% deviation from the expected contact resonance frequency, preferably within 10% deviation from the expected contact resonance frequency, more preferably within 5% deviation from the expected contact resonance frequency, or is selected to be equal to the expected contact resonance frequency. As stated above, a modulation frequency that is selected to be close to the contact resonance frequency results in a strong response to changes in the contact stiffness due to the resulting shift in contact resonance frequency.

To enable accurate measurement of the chemical modification as indicated, the modulation frequency needs to be properly set to a value that is sufficiently close to the contact resonance frequency to provide a significant response to changes thereof. For this reason, the contact resonance frequency must be known or must be at least estimated to enable the method to be tuned to the combination of the probe and the substrate. In accordance with some embodiments therefore, the method further comprises a step of determining the expected contact resonance frequency, wherein the step of determining comprises at least one of: performing numerical simulation of a tip-sample interaction between the probe tip and the substrate surface and calculating the expected contact resonance frequency therefrom; or applying at a test location on the substrate surface, using a dither transducer, an input vibration at an input frequency to the probe, and varying the input frequency and sensing a probe deflection output for determining the expected contact resonance frequency; or prior to said step of scanning, applying the acoustic signal to the substrate while simultaneously contacting the substrate surface with the probe tip at the test location, and varying the modulation signal while sensing a response signal of the probe for determining the expected contact resonance frequency. Any of the above techniques may be applies to obtain insight in the contact resonance frequency for enabling tuning of the process.

As indicated above, in accordance with some embodiments the step of scanning is performed during or after the step of selectively exposing. Yet in another embodiment, not only is the step of scanning is performed during or after exposing, but an additional step of scanning may be performed prior to exposure. Performing an additional scanning step prior to exposure allows the mapping of any subsurface structures present in layers of a semiconductor element underneath the top layer to be patterned. This, in combination with the subsequent scanning step after exposure of the resist material, enables to compare the two images obtained from the both scanning steps such as to reveal any overlay errors early on. Such information may for example subsequently be used to correct the exposure of the resist material for example using an accurately targeted electron beam.

In yet some embodiments of the invention, the method further comprises detecting, during said scanning, one or more defects in the chemically modified resist material, wherein the defects relate to patterning errors of the exposed resist material with respect to the patterning data or to overlay errors between the patterned resist material and a substrate layer underneath the resist material, wherein the method further comprises a further exposure step prior to said developing step for correcting the detected defects. As may be appreciated, the scanning step being performed for enabling detection of errors or defects prior to development of the resist material, the present method benefits from a further step of detection of defects and resolving thereof.

In some embodiments the surface treatment step comprises at least one of a group comprising: selectively exposing the resist material to optical radiation; selectively exposing the resist material to a plasma; or selectively impinging an electron beam onto the substrate surface, selectively exposing the resist material to gamma radiation, such as X-ray radiation; selectively exposing, using a scanning probe microscopy device, the resist material to at least one of thermal energy, an electric field or current, or a magnetic field. The skilled person will appreciate that the present invention may be applied in a variety of different nano-lithographic patterning methods.

In a second aspect, there is provided a method of manufacturing a semiconductor element, the method comprising applying one or more substrate layers onto a carrier for providing a substrate, wherein at least one of the one or more substrate layers is modified using a patterning method for creating features therein, wherein the patterning method includes a lithographic patterning method according to the first aspect. In yet another aspect of the invention, there is provided a semiconductor element manufactured using a method of the second aspect or using a patterning step corresponding with the first aspect.

BRIEF DESCRIPTION OF THE DRAWINGS

The invention will further be elucidated by description of some specific embodiments thereof, making reference to the attached drawings. The detailed description provides examples of possible implementations of the invention, but is not to be regarded as describing the only embodiments falling under the scope. The scope of the invention is defined in the claims, and the description is to be regarded as illustrative without being restrictive on the invention. In the drawings:

DETAILED DESCRIPTION

Figure 1:
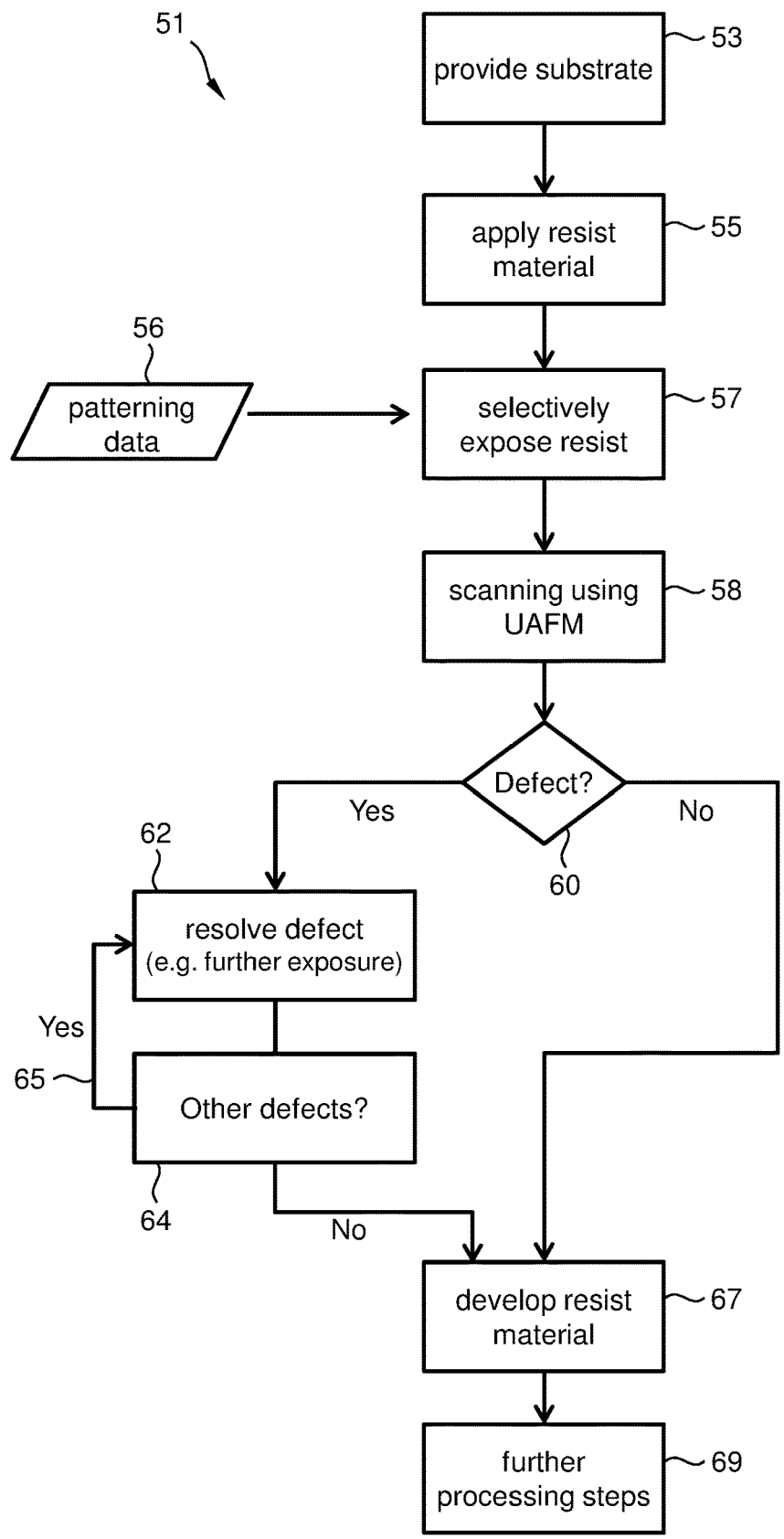
FIG. 1 schematically illustrates a nanolithographic manufacturing method in accordance with the present invention.
Figure 2:
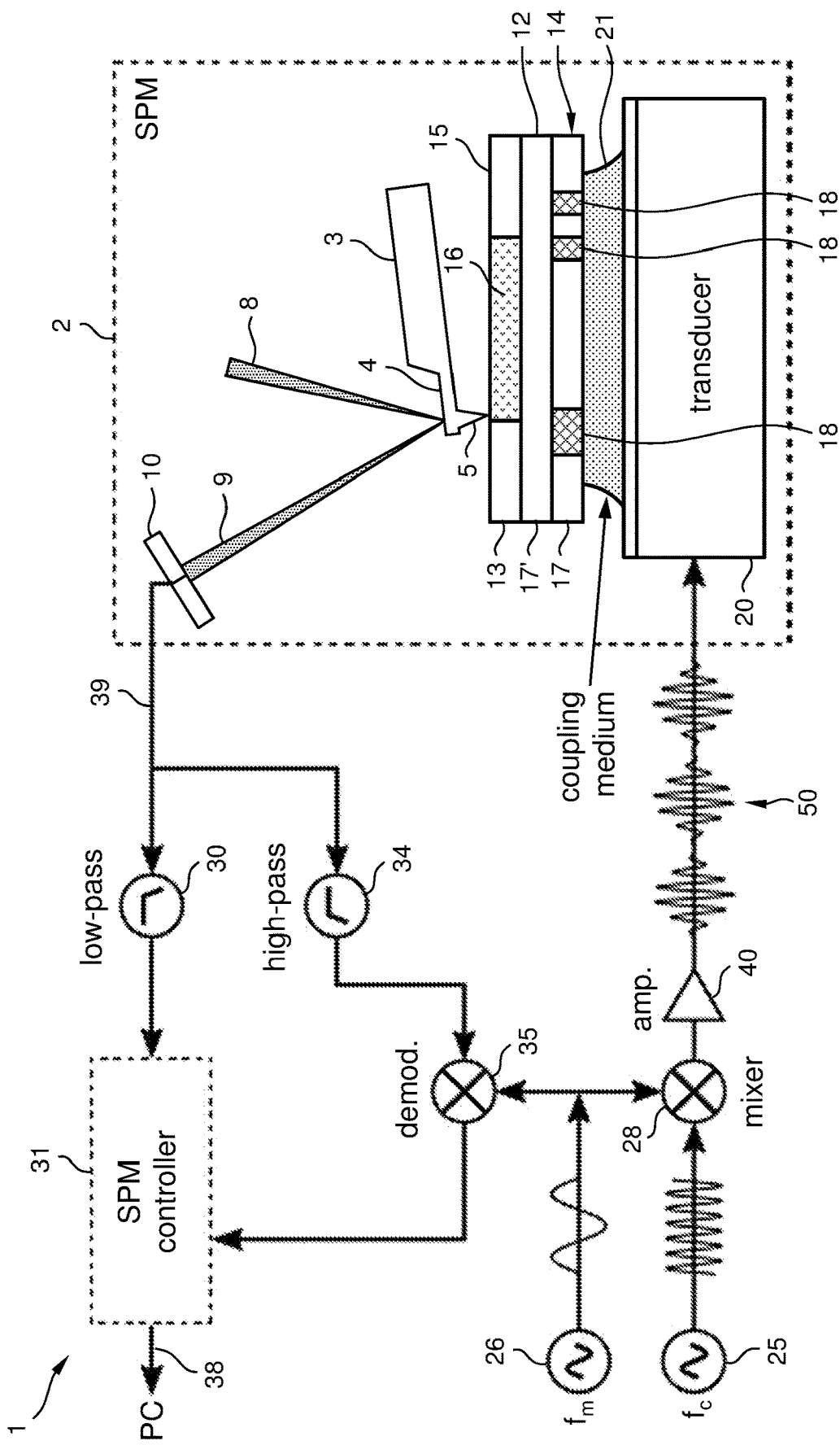
FIG. 2 schematically illustrates an atomic force microscopy system for performing ultrasonic atomic force microscopy.

FIG. 1 schematically illustrates a nanolithographic manufacturing method in accordance with the present invention. The method 51 amongst others applies an atomic force microscopy system (AFM) 1 as is schematically depicted in FIG. 2, for performing ultrasonic atomic force microscopy (UAFM).

In the method 51 illustrated in FIG. 1, a substrate or carrier is provided in step 53 on which a semiconductor device 14 may be formed by subsequently adding substrate layers and modifying these layers selectively to perform patterning and adding features. The latter is performed with the help of a layer of resist material, which is patterned by selectively exposing the resist material to a treatment step that causes the resist material locally to be chemically modified. Thereafter, during a development step, the chemically modified resist material can be selectively removed by making use of the modified material properties of the chemically modified resist material vis-à-vis the original unmodified resist material. After removal, the so patterned resist layer enables further processing of the substrate layer underneath, e.g. by etching those parts that are left uncovered by the removal of the resist layer. Other processing steps may of course alternatively or additionally applied.

Referring to FIG. 1, in order to apply the lithographic method of the invention for patterning, a resist material layer 13 is formed on the top surface of the substrate in step 55. This resist material layer may for example be formed using a spin coating process, an atomic layer deposition (ALD) method, a chemical vapour deposition method, a physical vapor deposition method, spraying, sputtering, powder coating, a roll-to-roll type coating method (e.g. air knife coating, hot melt coating, immersion dip coating, roll-to-roll ALD, etc.), or any other suitable coating method. The method continues in step 57, wherein the resist material layer 13 is selectively exposed to a treatment step to locally perform a chemical modification of the resist material that later allows the selective removal thereof. Many different types of treatment steps may be applied here, as the skilled person will appreciate. In fact, any commonly applied types of treatment steps applied during conventional lithographic methods may likewise be applied in the method of the present invention. Particular treatments that may be applied during the treatment step comprise at least one of a group comprising: selectively exposing the resist material to optical radiation; selectively exposing the resist material to a plasma; or selectively impinging an electron beam onto the substrate surface, selectively exposing the resist material to gamma radiation, such as X-ray radiation; selectively exposing, using a scanning probe microscopy device, the resist material to at least one of thermal energy, an electric field or current, or a magnetic field.

The selective exposure of the resist material is performed based on patterning data 56 obtained from a controller system or another suitable data source used in the process. The patterning data may specify at least for the respective layer to be formed, where on the surface of the resist material layer 13 the exposure is to take place such as to locally modify the resist material in that location. For example, the patterning data may contain layer data including a surface map or a matrix resembling the surface, wherein for each location on the surface it is indicated whether or not the treatment step is to be performed. This may simply be a bitmap indicating with Boolean values whether or not treatment is to take place at the given location. However, additional data may likewise be provided per location or per 'pixel', for example indicating preferred treatment parameters for that pixel (such as intensity, frequency, duration, or any other relevant parameter). The patterning data 56 may relate to one or more layers to be patterned or may contain layer data of all layers to be created for the device. Moreover, this patterning data may be available in a single data file or in several complementary data files, without departing from the invention.

The next step in the process, in accordance with the present invention, relates to verifying whether or not the selectively exposed resist material layer is correctly patterned (e.g. the detection of defects), and whether the requirements of the device with respect to critical dimensions for proper operation are met. Hereto, the method of the present invention, prior to the development step 67 later in the method, applies a step 58 of scanning at least a part of the surface 15 using an acoustic scanning probe microscopy system 1 for determining a local contact stiffness of the substrate surface 15 at a plurality of locations, for measuring one or more critical dimensions of the features to be formed on the surface. In FIG. 1, the acoustic scanning probe microscopy method applied is an ultrasound atomic force microscopy (UAFM) method. This method, although it may be applied to detect subsurface structures (e.g. such as device features 18 of device 14 to be created (FIG. 2)) or details, here is in the first place applied to detect and map the chemical modifications 16 in the resist material 13. By detecting the locations, sizes and shapes of chemically modified volumes 16 in the resist material 13, it is directly possible to verify the critical dimensions of the features to be formed, i.e. the features to be formed later during steps 67 and 69. For example, the information obtained in respect of these chemically modified volumes 16 may be compared with the patterning data 56 to identify defects, such as underexposed areas. Prior to the development step 67, the pattering of the resist layer 13 may be corrected on the basis of that information.

As a further improvement, in some embodiments the acoustic scanning probe microscopy step may be used to additionally perform subsurface imaging of device features 18 in lower layers of the substrate. For example, the ultrasound atomic force microscopy (UAFM) method may be used to obtain measurement data of the chemically modified volumes 16 and the subsurface features 18 simultaneously, and an overlay map may be made available from that measurement data. This enables to identify overlay errors in the patterning of the resist material 13, by comparing the data obtained from the chemically modified volumes 16 with respect to the features 18 underneath. The verification of overlay will be briefly explained with an example in FIGS. 3A and 3B further down below, and a measurement map obtained using an UAFM system is illustrated in FIG. 4 in connection with the example of FIGS. 3A and 3B. The description will presently continue with the remainder of the method illustrated in FIG. 1.

Any defects, overlay errors or errors in respect of critical dimensions that are detected during the scanning step 58, may still be corrected prior to development in step 67. Correction may occasionally (dependent on the error and the action required to resolve it) even be possible after development, however this is more cumbersome as it usually requires the removal of a complete resist layer 13 which is typically not desired. The main advantage of the invention is that it allows to resolve many errors at an early stage prior to development step 67. In that early stage, such errors are easily resolvable without having to remove the resist layer 13. By detecting a defect or overlay error in step 58 prior to developing step 67, is may many times be possible to resolve a defect by performing, for example, a further exposure locally where the defect is found. For example, the resist material 13 may locally be exposed to radiation from an electron beam (e-beam) to further expose an underexposed region.

In step 60, a controller or analysis system determines on the basis of the measurement data from step 58, whether the selectively exposed resist material layer 13 contains any defects or areas in which the patterning requires correction. If no such areas are detected, the process continues with developing of the resist material in step 67. Otherwise, however, in step 62 the defect is resolved for example by further local exposure. Alternatively, the AFM system may be used to locally modify the resist material, for example by applying an electric field or by using the probe to mechanically micro-machine the surface. Many alternative or additional correction methods may be applied during step 62 to resolve the defect, some of which may become apparent to the skilled person upon reading this description. Without departing from the present invention, such correction steps may be applied here.

After step 62, the method will continue in step 64 wherein the controller or analysis system determines whether there are any other defects in the selectively exposed resist material layer 13. If so, the method will return to step 62, as indicated by arrow 65. If no further defects or areas that are to be corrected are detected, the method continues with step 67.

In step 67, the resist material will be developed such as to selectively remove the chemically modified volumes thereof (or alternatively, to leave the chemically modified volumes in place while removing the unmodified volumes of resist material). The development step is a known processing step in lithographic methods and requires no detailed description here. After the developing, further processing steps, such as etching the substrate or refilling etch cavities with other functional substances, may be performed in step 69 such as to create the desired device features in this subsequent layer.

A system 1 that may be applied to perform the scanning step described above in relation to FIG. 1, is schematically illustrated in FIG. 2, and comprises a scanning probe microscope (SPM) 2 comprising a probe 3 having a cantilever 4 and a probe tip 5. The probe tip 5 is brought in contact with a surface 15 of a sample 12 comprising a semi-manufactured semiconductor element 14. A light source 7, typically a laser, provides an optical signal beam 8 that is incident on the back of the probe tip 5. A reflected optical beam 9 is received by an optical sensor 10. Any vibration of the probe tip 5 perpendicular to the surface 15 of the sample 12 will result in a deflection of the reflected optical beam 9. This deflection can be accurately determined by means of optical sensor 10 which provides an (electrical) output signal 39 for further analysis.

For performing the scanning step during the lithographic manufacturing method of the present invention, an acoustic vibration signal 50 is applied to the sample 12. The acoustic vibrations 50 may be sensed again by the probe tip 5 with great accuracy and decomposition of the input and output signals may effectively be achieved via an analysis system, for example analysis system 38. In the photo resist layer 13, this enables the detection chemically modified areas 16 such that after the step of selective exposure 57, the scanning step enables verification of the pattern applied to the photo resist 13 via the exposure. This enables to monitor the critical dimensions, and additionally any defects may advantageously be detected. Optionally and additionally, the scanning step using UAFM enables the detection of sub-surface features 18 e.g. in lower layers 17 of the semi-manufactured semiconductor element 14. Combining this information enables the verification of overlay errors (e.g. see FIGS. 3A and 3B and FIG. 4).

In the system 1 of FIG. 2, the acoustic vibration signal may be applied using a transducer 20 mounted underneath the substrate 12, with a coupling medium 21 to improve the signal transfer from the transducer 20 to the sample 12. This allows an acoustic signal produced by the transducer 20 to penetrate sample 12. In respect of this, it is noted that it is not essential to the invention to apply the acoustic signal via the substrate (either from the underneath the sample 12 (as illustrated) or from the side). Alternatively, it may also be applied via the probe tip 5.

The sample 12 in FIG. 1 may comprise one or more optional device layers 17 comprising features 18 of the semiconductor device 14 that is being manufactured. The upper substrate layer 17' is eventually to be provided with additional features 18 to form the device 14, with the help of a resist material. Thereto, a resist material layer 13 is applied on top of the upper substrate layer 17', which has been selectively exposed in step 57 to a suitable surface treatment step resulting in volumes 16 wherein the resist material has been chemically modified to enable the forming of the further device features. The semiconductor element 14 in FIG. 1 is a semi-manufactured semiconductor element, thus it is being manufactured and subsequent to the present layer 17' that is to be formed, may or may not receive additional layers later on. As may be appreciated, the sample 12 illustrated in FIG. 1 (and also the samples illustrated in other figures throughout this document) are merely examples. Features 18 of earlier layers 17 are buried underneath the surface 15 and the various upper layers 13 and 17'.

Dependent on the frequency of the acoustic signals applied, acoustic detection methods applied to perform the scanning step 58 of the present invention, operate on the basis of variations in the elasticity of the surface (low frequency, e.g. up to 250 megahertz), i.e. variations in the location dependent contact stiffness locally at the surface 15. These variations change the contact resonance frequency of the tip-sample combination. By applying an acoustic signal including a signal component having a frequency near the resonance frequency, any changes in the contact resonance frequency become measurable through the response of the probe tip 5 to the applied acoustic signal 50. For example, a shift in contact frequency may result in a change in amplitude. For this, the acoustic signal may comprise a signal component having a frequency which is close to the expected or earlier determined contact resonance frequency, e.g. within 20% deviation from the expected contact resonance frequency, preferably within 10% deviation from the expected contact resonance frequency, more preferably within 5% deviation from the expected contact resonance frequency, or on the expected or earlier determined contact frequency of the tip-sample combination.

There are various possibilities for obtaining the desired information from the output signal 39 using the system 1 of FIG. 2. Primarily, by leading the output signal 39 through low-pass filter 30, the low frequency components of the output signal 39 may be provided to a scanning probe microscope controller 31. This controller 31 may cooperate a proportional-integral-differential (PID) feedback controller (not shown) to control an AFM Z-piezo element (not shown) to maintain the probe tip 5 at its setpoint force in feedback mode.

The acoustic vibration signal 50 to be provided via the transducer 20 to the sample 12 consists of a high frequency component and a low frequency component $f_m$, and is created as follows. One or more signal generators 29 comprise at least first frequency generator 25, a second frequency generator 26, and a signal mixer 28. A high frequency input signal component $f_c$ and a low frequency input signal component $f_m$, provided by the first frequency generator 25 and second frequency generator 26 respectively, are mixed by mixer 28, amplified by amplifier 40 and provided to the transducer 20. The transducer 20 sends the acoustic vibration signal into the material of the sample 12. The sensor signal from optical sensor 10 is provided to a low-pass filter 30 for contact mode feedback, and the output of the low-pass filter 30 is sent to the SPM controller 31. The low pass filter has a cutoff frequency of, for example, around 2 kHz. This is fast enough with respect to the scanning speed, but only slightly higher than the sampling rate (e.g. 1024 pixels in 1 second corresponds to a sampling rate of 1.024 kHz). SPM controller 31 uses the contact mode feedback signal to maintain the AFM system fixed at its setpoint force.

The output signal 39 from the optical sensor 10 is further provided to a high-pass filter 34. The high pass filter 34 also has a cutoff frequency of, for example, around 2 kHz, thus thereby transmitting the second fraction of the output signal 39 including the high frequency ultrasound carrier signal (i.e. including component $f_c$) and the low frequency modulation signal (i.e. including component $f_m$) to the demodulator 35. The demodulator 35 further receives the low frequency input signal $f_m$ as a reference signal. An output signal of the demodulator 35 is provided to analysis system 38 via controller 31 which allows to analyze the location dependent ultrasound output signal to obtain the measurement information on the contact stiffness. From this, the desired data on chemical modification volumes 16 in the resist material 13 and optionally the data on features 18 in deeper layers 17 may be obtained. Frequency generators 25 and 26, mixer 28, demodulator 35, and optionally analysis system 38 may form an integral system.

Figure 3A:
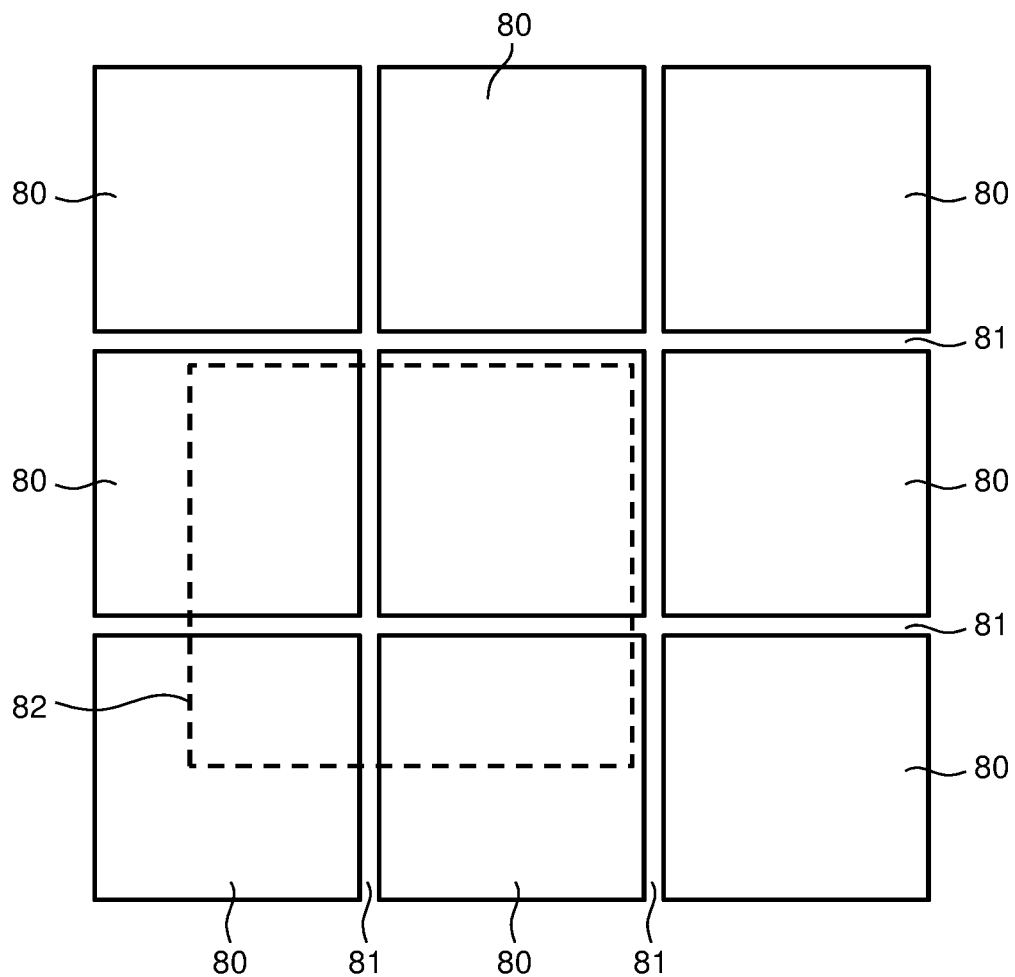
FIGS. 3A and 3B schematically illustrate the principle of early verification of overlay of the patterning process.
Figure 3B:
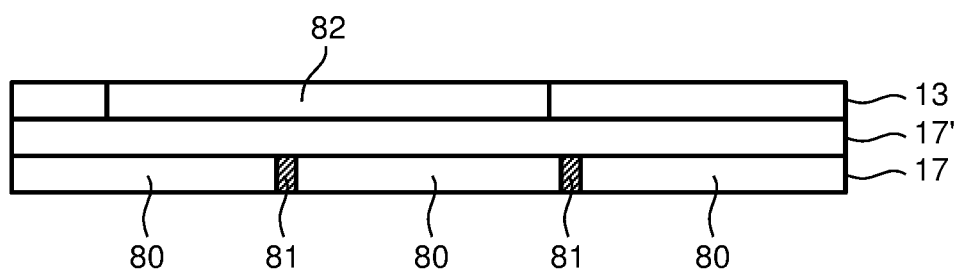
Figure 4:
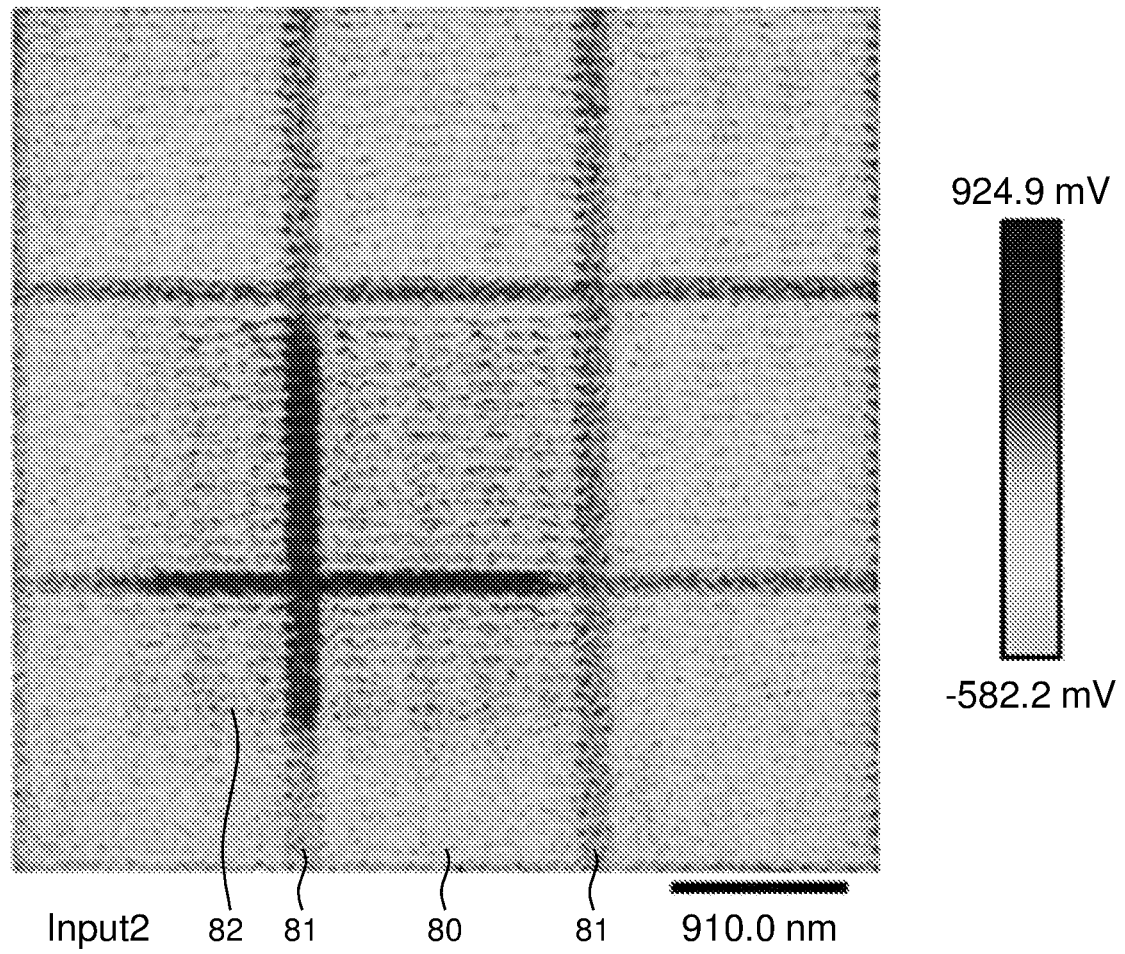
FIG. 4 provides a measurement map obtained using an UAFM system, in connection with the example of FIGS. 3A and 3B.

FIGS. 3A and 3B illustrate the principle of early verification of overlay of the patterning process. In FIG. 3B, a plurality of substrate layers includes substrate layer 17 with device features 80 and 81, upper substrate layer 17' to be processed for creating device features, and resist material layer 13 on top of layer 17'. The device features in layer 17 include a plurality of patches 80 of a certain functional semiconductor material, separated by isolating barriers 81 of an electrically isolating material. Certain of the patches 80 are to be overlayed by an electrode patch 82 to be created in substrate layer 17'. The resist layer 13 is exposed on the basis of patterning data indicating the location of the device feature, e.g. the location of electrode patch 82. In the subsequent ultrasound AFM step, the chemical modification of the resist material 13 in patch 82 becomes apparent. This is illustrated in FIG. 3A by the dotted lined feature 82. Also visible are the subsurface structures 80 and 81 in substrate layer 17, due to the fact that ultrasonic AFM (UAFM) provides such information as a byproduct in case the depth of measurement is well tuned. This provides the overlay map illustrated in FIG. 3A. A real measurement and mapping of the above example can be seen in FIG. 4. FIG. 4 clearly shows the presence of a chemical modification 82 in the microscopic map, as well as subsurface features 80 and 81.

The application of UAFM allows the detection of features at nanometer scale, and may thus be used in combination with nanolithography to detect even the smallest defects, errors and verify critical dimensions. For example, features of 1 nanometer in size and larger are well visible.

The present invention has been described in terms of some specific embodiments thereof. It will be appreciated that the embodiments shown in the drawings and described herein are intended for illustrated purposes only and are not by any manner or means intended to be restrictive on the invention. It is believed that the operation and construction of the present invention will be apparent from the foregoing description and drawings appended thereto. It will be clear to the skilled person that the invention is not limited to any embodiment herein described and that modifications are possible which should be considered within the scope of the appended claims. Also kinematic inversions are considered inherently disclosed and to be within the scope of the invention. Moreover, any of the components and elements of the various embodiments disclosed may be combined or may be incorporated in other embodiments where considered necessary, desired or preferred, without departing from the scope of the invention as defined in the claims.

In the claims, any reference signs shall not be construed as limiting the claim. The term 'comprising' and 'including' when used in this description or the appended claims should not be construed in an exclusive or exhaustive sense but rather in an inclusive sense. Thus the expression 'comprising' as used herein does not exclude the presence of other elements or steps in addition to those listed in any claim. Furthermore, the words 'a' and 'an' shall not be construed as limited to 'only one', but instead are used to mean 'at least one', and do not exclude a plurality. Features that are not specifically or explicitly described or claimed may be additionally included in the structure of the invention within its scope. Expressions such as: "means for . . . " should be read as: "component configured for . . . " or "member constructed to . . . " and should be construed to include equivalents for the structures disclosed. The use of expressions like: "critical", "preferred", "especially preferred" etc. is not intended to limit the invention. Additions, deletions, and modifications within the purview of the skilled person may generally be made without departing from the spirit and scope of the invention, as is determined by the claims. The invention may be practiced otherwise then as specifically described herein, and is only limited by the appended claims.

The invention claimed is:

1. A lithographic patterning method for creating features on a substrate surface of a substrate, the patterning method comprising:
   providing a resist material layer by applying a resist material to the substrate surface;
   selectively exposing, dependent on a location and based on patterning data, the resist material layer to a surface treatment for chemically modifying the resist material of the resist material layer; and
   developing, based on the chemical modification of the resist material, the resist material layer so as to selectively remove the resist material;
   wherein the method further comprises scanning, prior to the developing, at least a part of a surface using an acoustic scanning probe microscopy method for determining a local contact stiffness of the substrate surface at a plurality of locations, to measure one or more critical dimensions of the features to be formed on the surface.

2. The lithographic patterning method according to claim 1, wherein the scanning comprises:

applying, using a sample transducer, an acoustic signal to the substrate while simultaneously contacting the substrate surface with a probe tip of a probe of a scanning probe microscopy device, wherein the acoustic signal includes a carrier frequency that is modulated with a modulation frequency, wherein the modulation frequency is selected to be on or near an expected contact resonance frequency of the probe with respect to the substrate surface.

3. The lithographic patterning method according to claim 2, wherein the modulation frequency is selected to be within at most a 20% deviation from the expected contact resonance frequency.

4. The lithographic patterning method according to claim 2, further comprising:
    determining the expected contact resonance frequency, wherein the determining comprises at least one operation taken from the group consisting of:
        performing numerical simulation of a tip-sample interaction between the probe tip and the substrate surface and calculating the expected contact resonance frequency therefrom;
        applying at a test location on the substrate surface, using a dither transducer, an input vibration at an input frequency to the probe, and varying the input frequency and sensing a probe deflection output for determining the expected contact resonance frequency; and
        prior to said step of scanning, applying the acoustic signal to the substrate while simultaneously contacting the substrate surface with the probe tip at the test location, and varying the modulation signal while sensing a response signal of the probe for determining the expected contact resonance frequency.

5. The lithographic patterning method according to claim 2, wherein the modulation frequency is selected to be within at most a 10% deviation from the expected contact resonance frequency.

6. The lithographic patterning method according to claim 2, wherein the modulation frequency is selected to be within at most a 5% deviation from the expected contact resonance frequency.

7. The lithographic patterning method according to claim 2, wherein the modulation frequency is selected to be equal to the expected contact resonance frequency.

8. The lithographic patterning method according to claim 1, wherein the scanning is performed during or after the selectively exposing.

9. The lithographic patterning method according to claim 1, further including an additional scanning at least part of the surface using acoustic scanning probe microscopy, wherein the additional scanning is performed prior to the selectively exposing.

10. The lithographic patterning method according to claim 9, further including comparing an image obtained from performing the scanning with an image obtained from performing the additional scanning so as to detect an overlay error in the selectively exposed resist material layer.

11. The lithographic patterning method according to claim 1, further comprising:
    detecting, during said scanning, one or more defects in the chemically modified resist material, wherein the defects relate to patterning errors of the exposed resist material with respect to the patterning data or to overlay errors between the patterned resist material and a substrate layer underneath the resist material, and
    wherein the method further comprises performing a further exposure, in accordance with the detecting one or more defects, prior to the developing for correcting the one or more defects.

12. The lithographic patterning method according to claim 1, wherein the selectively exposing the resist material layer to a surface treatment comprises at least one of the group consisting of:
    selectively exposing the resist material to optical radiation;
    selectively exposing the resist material to a plasma;
    selectively impinging an electron beam onto the substrate surface,
    selectively exposing the resist material to gamma radiation; and
    selectively exposing, using a scanning probe microscopy device, the resist material to at least one of the group consisting of: thermal energy, an electric field or current, and a magnetic field.

13. A method of manufacturing a semiconductor element, the method comprising applying one or more substrate layers onto a carrier for providing a substrate,
    wherein at least one of the one or more substrate layers is modified using a patterning method for creating features therein,
    wherein the patterning method includes a lithographic patterning method comprising:
        providing a resist material layer by applying a resist material to the substrate surface:
        selectively exposing, dependent on a location and based on patterning data, the resist material layer to a surface treatment for chemically modifying the resist material of the resist material layer; and
        developing, based on the chemical modification of the resist material, the resist material layer so as to selectively remove the resist material;
    wherein the method further comprises scanning, prior to the developing, at least a part of a surface using an acoustic scanning probe microscopy method for determining a local contact stiffness of the substrate surface at a plurality of locations, to measure one or more critical dimensions of the features to be formed on the surface.

14. A semiconductor element manufactured using the method of claim 13.

* * * * *